United States Patent
Wood et al.

(10) Patent No.: US 9,939,875 B2
(45) Date of Patent: Apr. 10, 2018

(54) POWER SUPPLY SYSTEM FOR USE WITH ELECTRONIC GAMING TABLES IN A CASINO

(71) Applicants: Raritan Americas, Inc., Somerset, NJ (US); Sunbird Software, Inc., Somerset, NJ (US)

(72) Inventors: David Wood, Furlong, PA (US); Bunty Nasta, Austin, TX (US)

(73) Assignees: Raritan Americas, Inc., Someset, NJ (US); Sunbird Software, Inc., Somerset, NJ (US)

(*) Notice: Subject to any disclaimer, the term of this patent is extended or adjusted under 35 U.S.C. 154(b) by 9 days.

(21) Appl. No.: 15/248,740

(22) Filed: Aug. 26, 2016

(65) Prior Publication Data
US 2017/0160787 A1   Jun. 8, 2017

Related U.S. Application Data

(63) Continuation-in-part of application No. 14/011,848, filed on Aug. 28, 2013, now Pat. No. 9,429,984.

(51) Int. Cl.
  *G06F 1/26*    (2006.01)
  *G06F 1/32*    (2006.01)
  *A63F 13/92*   (2014.01)
  *A63F 5/00*    (2006.01)
  *G06F 11/14*   (2006.01)
  *G07F 17/32*   (2006.01)

(52) U.S. Cl.
  CPC .............. *G06F 1/3218* (2013.01); *A63F 5/00* (2013.01); *A63F 13/92* (2014.09); *G06F 1/3231* (2013.01); *G06F 1/3237* (2013.01); *G06F 11/1441* (2013.01); *G07F 17/322* (2013.01); *G07F 17/3216* (2013.01); *G07F 17/3241* (2013.01); *G07F 17/3244* (2013.01)

(58) Field of Classification Search
  CPC ............. G07F 17/3216; G07F 17/3244; G07F 17/322; G07F 17/3241
  USPC ........................................ 713/300, 320, 340
  See application file for complete search history.

(56) References Cited

U.S. PATENT DOCUMENTS

2008/0274798 A1* 11/2008 Walker .................... G07F 17/32
                                                        463/25

* cited by examiner

*Primary Examiner* — Michael J Brown
(74) *Attorney, Agent, or Firm* — Mark H. Jay

(57) ABSTRACT

A power supply system for use with electronic gaming tables in a casino is disclosed. Each gaming table is associated with a unique iPDU and is viewed by one or more video cameras. When an electronic device in a table fails or is taken offline, regulatory personnel can review the video record that corresponds to the duration of the failure or offline status to determine whether the dealer or a bettor has caused the failure or offline status to come about.

7 Claims, 5 Drawing Sheets

POWER SUPPLY SYSTEM FOR USE WITH ELECTRONIC GAMING TABLES IN A CASINO

CROSS-REFERENCE TO RELATED APPLICATIONS

This application is a continuation-in-part of application Ser. No. 14/011,848, filed Aug. 28, 2013. The entire disclosure of this parent application, including the drawings, is hereby incorporated herein as if fully set forth herein.

BACKGROUND OF THE INVENTION

The invention relates to power supply systems, and more particularly relates to power supply systems for use in casinos. In its most immediate sense, the invention relates to power supply systems for use with electronic gaming tables such as are used in modern casinos.

An electronic gaming table such as is conventionally used in a modern casino contains many electronic devices (e.g. servers, video screens, controls, sensors etc.). The gaming table has a dealer station and plurality of electronic gaming stations at which individual bettors can gamble. For example, an electronic blackjack table might have a dealer station for the dealer and nine gaming stations to accommodate as many as nine bettors. The dealer station will have a video screen and dealer controls, and each of the gaming stations will have a video screen and gaming controls (which may be integrated with the video screen if the video screen is a touch screen). With such an arrangement, a bettor can see his hand on his video screen and the dealer's hand on the dealer's video screen, can place a bet by operating the appropriate control, and can e.g. direct the dealer to "hit me" by operating the appropriate control. Cards dealt to the bettors appear on their video screens, cards dealt to the dealer appear on the dealer's video screen for the bettors to see, and wins and losses from the bets placed are automatically tracked.

Supplying power to the electronic devices in an electronic gaming table is not a simple task because of requirements imposed by regulatory authorities. For example, to insure that casino gaming is conducted honestly, the Casino Regulatory Authority of Singapore (the "CRA") requires that the operation of an electronic gaming table must be auditable and that any malfunction in an electronic gaming table must be reported. And, the CRA also requires that a video record of play at an electronic gaming table be made and maintained. Such a video record is especially important if the gaming table malfunctions; a video record can e.g. show if a bettor or a dealer has deliberately caused the malfunction in order to induce an advantageous game state. Thus, power must be supplied to all the electronic devices in the gaming table in such a manner that a malfunction in any of the devices will be recorded, and in a manner that the video record of activities occurring during the duration of the malfunction can be identified and examined to determine whether a bettor or the dealer caused the malfunction to come about.

Additionally, a power supply system used to power electronic devices in an electronic gaming table is a mission-critical component. This is because casinos rely upon every electronic gaming table to produces a substantial revenue stream. If a table malfunction occurs, the table must be shut down and while it remains shut down the casino loses the revenue that the table produces. Inasmuch as many malfunctions in electronic devices such as servers, video screens, controls, sensors etc. are preceded by power events (e.g. excessive or insufficient power consumption) that indicate that a malfunction will soon occur, it is advantageous to monitor the power consumption of the electronic devices in an electronic gaming table so that devices with suspect power consumption can be taken off line and replaced before they malfunction.

The invention proceeds from a realization that the problems faced by a casino in supplying power to the electronic devices in an electronic gaming table are similar to the problems faced by the operator of a server farm in supplying power to an equipment rack in the server farm, and that using an iPDU for each table facilitates localization of malfunctioning and potentially malfunctioning equipment. In accordance with the invention, a power supply system is provided. The power supply system supplies power to electronic devices associated with a single casino electronic gaming table. The table has a plurality of electronic gaming stations at which individual bettors can gamble. At least one of the devices is a video camera that is aimed at the table and that creates a video record of actions of at least one person at the table, such video record being synchronized with time. A network is provided, as is an intelligent power distribution unit ("iPDU"). The iPDU supplies power to selected ones of the electronic devices and operates to monitor the power consumption of each of those devices, to periodically report to the network said power consumption as a function of time, to disconnect individual ones of the devices from power when the power consumption of said individual ones meets predetermined conditions, to reconnect said individual ones in response to instructions received from the network, and to create an event log indicating which electronic devices have been so disconnected and reconnected and the times when such disconnection and reconnection have occurred. The video camera reports the video record as a function of time to the network, and the network includes means for synchronizing the event log with the video record, whereby such actions of persons at the table can be correlated with disconnections and reconnections of individual ones of said electronic devices.

By having electronic devices associated with a single electronic gaming table powered by a single iPDU, the casino can immediately identify the specific gaming table and device where a malfunction or an incipient malfunction exists. And, the network's capability to synchronize the event log with the corresponding video records of activity at the table makes it possible to detect (or to rule out) deliberate acts of sabotage by persons at the table.

Advantageously, the iPDU includes a transfer switch that receives power from two independent power sources. The transfer switch operates in a manner that when power from one of the power sources becomes unavailable, power from another one of the power sources is used to supply electrical power to the electronic devices associated with the table.

BRIEF DESCRIPTION OF THE DRAWINGS

The invention will be better understood with reference to the following illustrative and non-limiting drawings, in which.

DETAILED DESCRIPTION OF PREFERRED EMBODIMENTS

Figure 1:
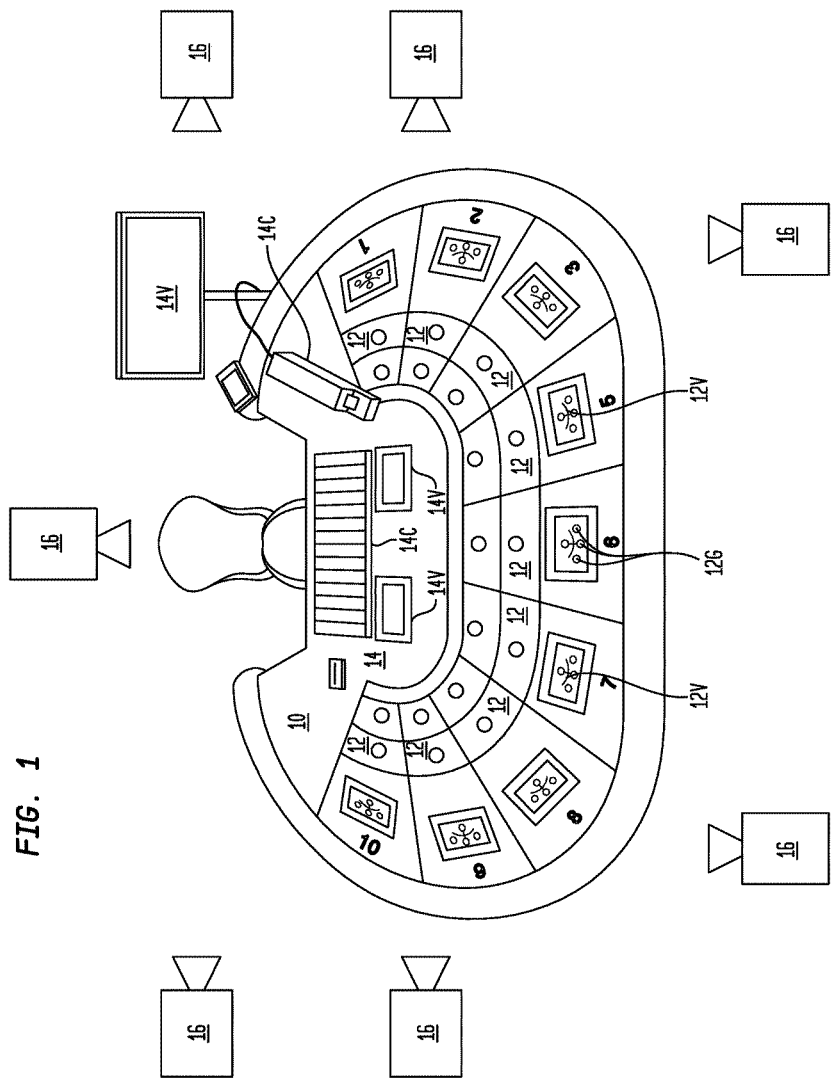
FIG. 1 schematically illustrates an electronic gaming table and associated video cameras in a casino.

For simplicity, the following description shows only a single electronic gaming table in which the invention has been installed and is operating. In fact, a casino routinely contains scores or hundreds of electronic gaming tables. The number of electronic gaming tables is not part of the invention. Additionally, the following description does not specify the details of the network(s) used in the data center. Networks are well-known and persons skilled in the art will be able to construct network(s) appropriate to the intended application. Furthermore, the same element is always indicated using the same reference numeral, and corresponding elements in different embodiments are indicated using primed reference numerals.

FIG. 1 shows an exemplary electronic gaming table generally indicated by reference numeral 10. The table has nine electronic gaming stations 12, but the number of gaming stations 12 is not a part of the invention and there may be more or fewer. A bettor (not shown) can sit at one of the gaming stations 12 and play an electronic game such as blackjack, baccarat, or roulette. The electronic game played at a station 12 of a gaming table 10 is not part of the invention.

Each gaming station 12 has a video screen 12V. In this example, the video screen 12V is a touch screen. Gaming controls 12G are regions located on the video screen 12V, whereby a bettor (not shown) can e.g. play the electronic game that is available at the table 10 by touching, sliding, or otherwise operating the gaming controls 12G. The form of the gaming controls 12G is not part of the invention and the gaming controls 12G may alternatively be mice, switches, buttons, sensors responding to the movement of poker chips, etc.

The table 10 also has a dealer station 14. The dealer (not shown) sits at the dealer station 14 to run the game that is played on the table 10. The dealer has a plurality of video screens 14V that are used in the running of the game; in this example there are three video screens 14V of which one is easily visible by the players, but the number and placement and type (e.g. touch screen or non-touch screen) of the video screens is not part of the invention. The dealer runs the game by operating dealer controls 14C. In this example, the dealer controls 14C are a keyboard and a hand-operated wand, but the form of the controls 14C is not part of the invention.

An array of video cameras 16 is aimed at the table 10 so as to view the dealer and bettors (not shown). Ordinarily, the video cameras 16 will be located where they will be difficult to spot and to obstruct, but the locations of the video cameras 16 is not a part of the invention. Seven cameras 16 are schematically illustrated in FIG. 1, but the number of cameras 16 is not part of the invention and there may be more or fewer.

Electronic devices such as servers, modems, and routers (not shown) are located beneath the table 10. It will be understood that a computer system is required to run an electronic game and to keep track of e.g. the identity of the dealer and bettors, the amounts wagered, won, and lost, etc. These devices are not part of the invention.

Figure 2:
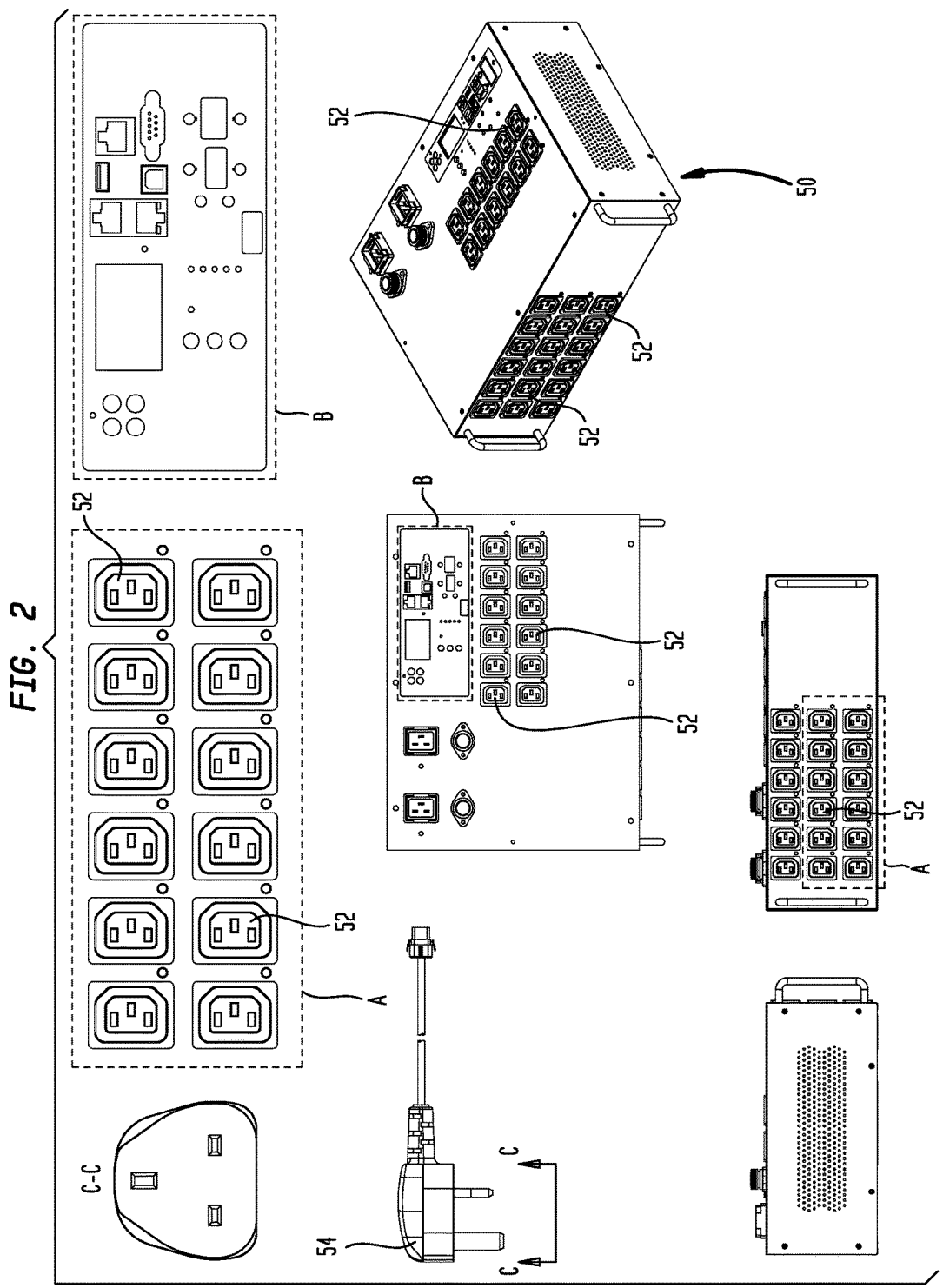
FIG. 2 shows an exterior view of an iPDU such as is used in the preferred embodiment of the invention.

An iPDU generally indicated by reference numeral 50 (FIG. 2) is located beneath the table 10. It has a plurality of female sockets 52 into which male plugs (not shown) can be inserted to provide power to the electronic devices associated with the table 10. Thus, the video screens 12V and 14V, the controls 14C, and the above-referenced devices such as servers, modems, routers etc. are all plugged into the iPDU 50 and powered by it. The cameras 16 may or may not be powered by the iPDU 50; this depends on where the cameras 16 are located and how cabling to the cameras 16 is routed.

As will be explained in more detail below, the iPDU 50 is powered by first and second independent power sources. A male plug 54 is plugged into the first power source, and another male plug 56 (FIG. 3) is plugged into the second power source. (Although as explained below there will usually be two independent power sources, this is not necessary but is preferred. And, the iPDU 50 may be powered by more independent power sources if ultra-high reliability is required.)

Figure 3A:
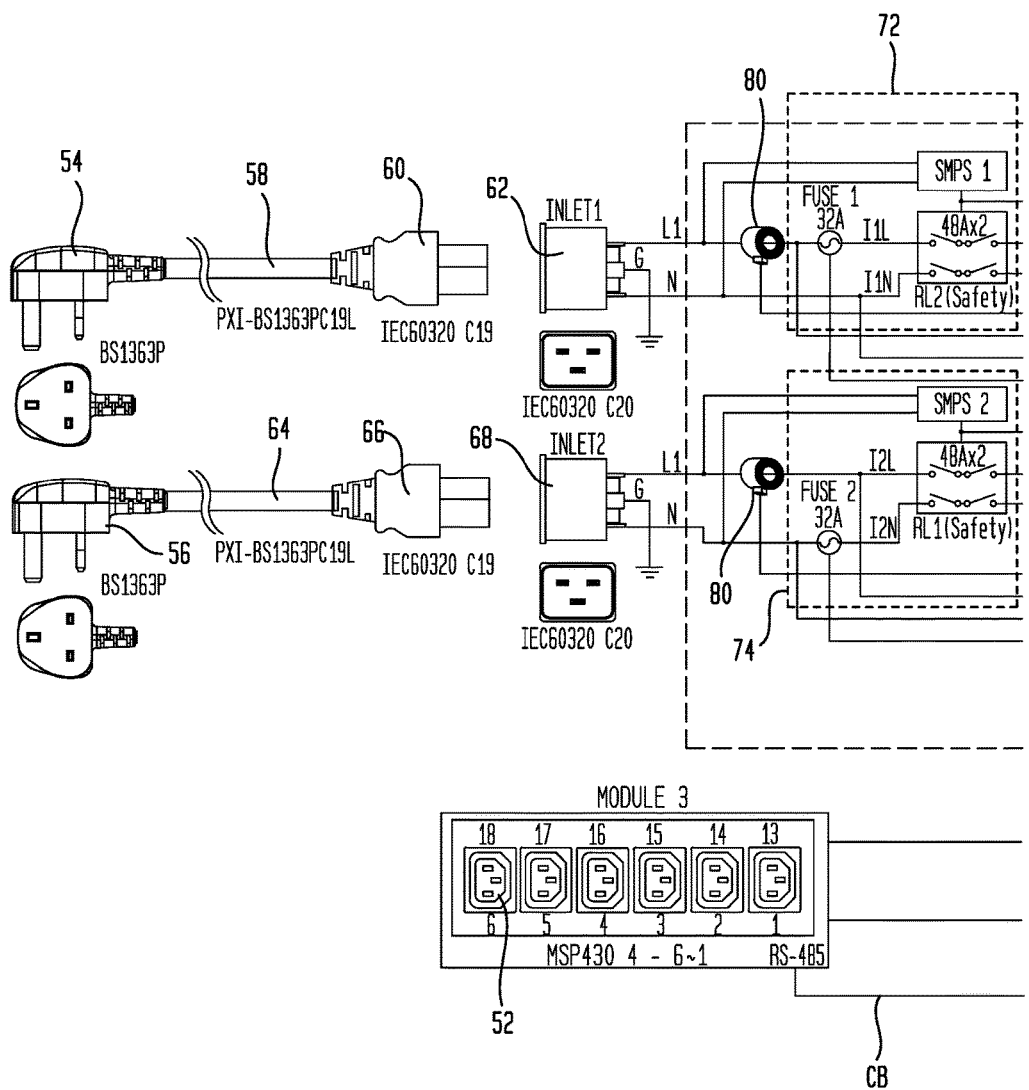
FIGS. 3A and 3B schematically illustrate the iPDU circuitry used in the preferred embodiment of the invention.
Figure 3B:
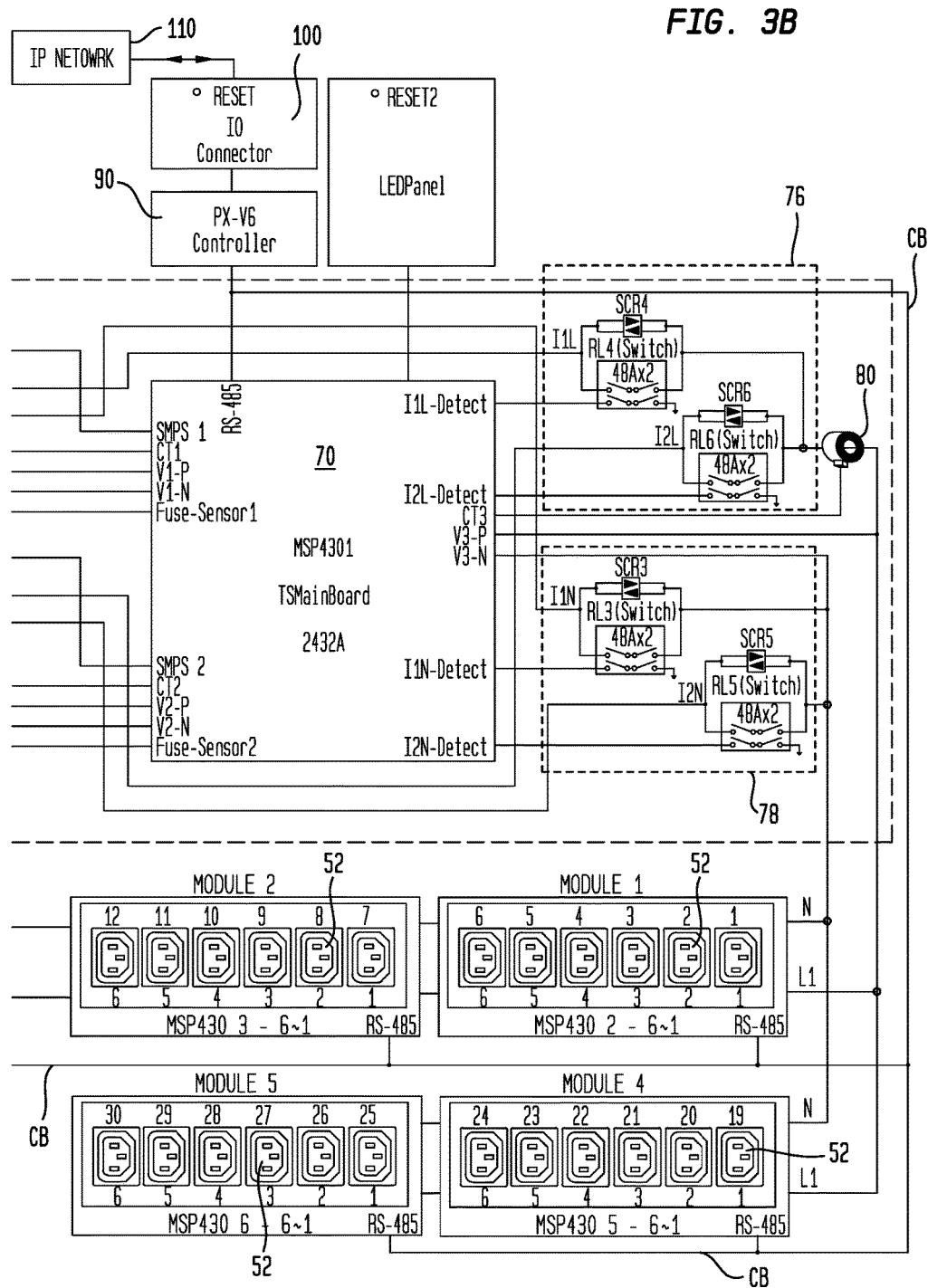

Referring now to FIG. 3, as stated above, the iPDU 50 is connected to the first and second independent power sources (such as from different circuits, which are preferably from different power chains) through male plugs 54 and 56. Plug 54 is connected to cord 58, which terminates in male plug 60. Plug 60 plugs into female socket 62 so as to supply incoming power to the iPDU 50. Similarly, plug 54 is connected cord 64, which terminates in male plug 66, and plug 66 plugs into female socket 68 so as to supply incoming power to the iPDU 50.

Lines L1 carry line voltage, and lines N are the neutral lines. They supply single-phase power to the female sockets 52. The sockets 52 are arranged in five modules (Module 1, Module 2, Module 3, Module 4, and Module 5), which will now be discussed.

The Modules 1, 2, 3, 4, and 5 are conventional. Each module performs three functions. First, each module supplies line power to the six sockets 52 that are mounted to it. Second, on commands issued by the main board CPU 70, each module monitors the power drawn from each of the six sockets 52 by the device supplied with power from that socket 52. Third, and likewise in response to commands issued by CPU 70, each module can disconnect and reconnect any or all of the sockets 52 (and, therefore, de-power and re-power the devices that are powered through those sockets 52).

Modules 1, 2, 3, 4, and 5 are connected to the CPU 70 by an internal control bus schematically indicated by lines CB. In use, and in response to commands issued by a network 110 (discussed below), the CPU 70 issues monitoring commands to the Modules 1, 2, 3, 4, and 5 and on receipt of a monitoring command each module monitors the power consumption at each device-connected socket 52. (As is disclosed in application Ser. No. 14/011,848, filed Aug. 28, 2013, this can be done by e.g. measuring average current consumption during a predetermined interval, minimum current consumption during a predetermined interval, maximum current consumption during a predetermined interval, instantaneous current consumption at the end of a predetermined interval, average voltage during a predetermined interval, minimum voltage during a predetermined interval, maximum voltage during a predetermined interval, instantaneous voltage at the end of a predetermined interval, average power consumption during a predetermined interval, minimum power consumption during a predetermined interval, maximum power consumption during a predetermined interval, instantaneous power consumption during a predetermined interval, or otherwise. A typical measurement duration is 300 seconds, but this duration can be longer or shorter.) When the measured power consumption at a particular socket 52 exceeds or fails to reach predetermined amounts, or exhibits a rate of change that is faster or slower than predetermined amounts, the CPU 70 issues a command along the bus CB that causes the applicable module to disconnect the power to that socket 52 (and to de-power the device that is plugged into that socket). (In this event, the CPU 70 generates an event log indicating what device is involved and when, and transmits this information to the network 110 discussed in more detail below.) When that device has been disconnected and replaced, or has been determined to be operating properly, the CPU 70 can be caused to issue another command along the bus CB to turn the socket 52 back on, and to report to the network 110 that the socket 52 and the device powered by it are back on line.

A circuit 72 is connected between the socket 62 and the CPU 70. This circuit is conventional. It is made up of a switch mode power supply SMPS1, a switch, and a fuse. The switch mode power supply converts input AC into DC for the logic and switching circuitry, the switch makes sure that only one of the independent power sources is connected at one time, and the fuse protects the downstream components in case one of the sockets 52 is overloaded (as would happen if a connected device such as a server would develop a short circuit). An identical circuit 74 is connected between socket 68 and the CPU 70, and performs the same functions. Although the use of these circuit 72 and 74 is preferred, they are not part of the invention.

Identical circuits 76 and 78 are located between the CPU 70 and the Modules 1, 2, 3, 4, and 5. These circuits are conventional. Each contains silicon-controlled-rectifiers and electromechanical relays. When one of the independent power sources goes down and the iPDU 50 switches over to the other power source, the circuits 76 and 78 cooperate to disconnect the Modules 1, 2, 3, 4, and 5 from the failed power source and to connect them to the other power source. Although the use of these circuits 76 and 78 is preferred, they are not part of the invention.

Current transformers 80 are used to measure current at the points indicated. Use of these is preferred, but they are not part of the invention.

In accordance with the invention, a network 110 is provided. In the preferred embodiment, the network 110 is an IP network but this is not required. The network 110 is connected to an I/O connector 100 in the iPDU 50, and the I/O connector 100 is connected to the CPU 70.

The operation of the preferred embodiment is described below, but as a preliminary matter it is important to understand that a casino will have scores or hundreds of gaming tables 10. In accordance with the invention, the iPDUs in each of them will be connected to the network 110. The network 110 will in turn be connected to, and managed by, a Data Center Infrastructure Management ("DCIM") system such as is available from Sunbird Software, Inc. (Somerset, N.J.).

Figure 4:
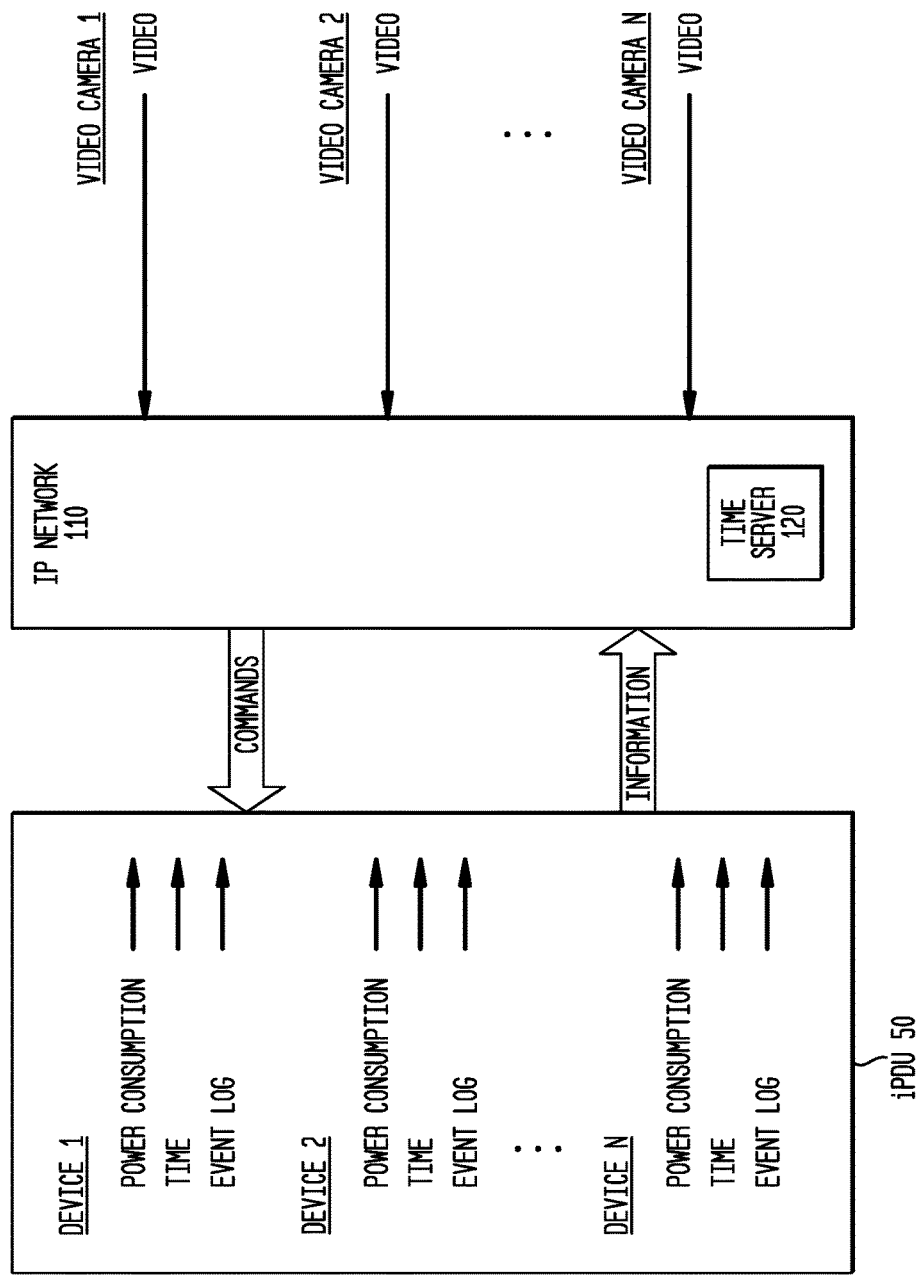
FIG. 4 schematically illustrates information flow in the preferred embodiment of the invention.

FIG. 4 schematically illustrates the flow of information inside the preferred embodiment of the invention. A single iPDU 50 monitors devices associated with a particular gaming table 10. For each device that is connected to the iPDU 50, the iPDU 50 routes three types of information into the network 110. The first type of information is the power consumption of the device being monitored. The second type of information is the time associated with such monitoring, and the third type of information is an event log that indicates the detection of a fault. Additionally, each of the video cameras 16 also feeds video information to the network 110 to form a video record of what happens within the field of view of that video camera 16.

The network 110 has a time server 120 that clocks the entire system. Application Ser. No. 14/011,848, filed Aug. 28, 2013 discloses a time synchronization system that collects information from iPDUs such as iPDU 50 with high accuracy. The there-disclosed synchronization system is used to synchronize the collection of information from each iPDU 50 and to synchronize that information (specifically including the event log) with the video record created by each video camera 16 that is associated with the iPDU 50 of interest. More specifically, the network 110, using the referenced time synchronization system, issues monitoring commands to each iPDU 50. In each iPDU 50, these commands cause the CPU 70 to issue monitoring commands to the Modules 1, 2, 3, 4, and 5 to cause the modules to monitor the power drawn at each of the sockets 52. If a device powered by one of the sockets 52 has an anomalous power consumption, the CPU 70 issues a command to the appropriate module to depower that socket and creates an event log identifying the depowered device and the time it was depowered.

As stated above, each video camera 16 that corresponds to iPDU 50 (i.e. that includes all or part of the table 10 in its field of view) creates a time-synchronized video record that is fed into the network 110. Because of the time synchronization system disclosed in application Ser. No. 14/011, 848, filed Aug. 28, 2013, when a device fails or is taken offline it is possible to accurately identify the portion(s) of the video record(s) from the corresponding video cameras 16 that correspond to the duration of the failure or offline status. This makes it possible for regulatory personnel to view the applicable video record(s) and to determine whether anyone at the involved table 10 may have done something to cause the failure or to cause the device to be brought offline.

Although at least one preferred embodiment has been described above, this description is not limiting and is only exemplary.

The scope of the invention is defined only by the following claims:

1. A power supply system for use with electronic devices associated with a single casino electronic gaming table having a plurality of electronic gaming stations at which individual bettors can gamble, such devices including at least one video camera that is aimed at the table and that creates a video record of actions of at least one person at the table, such video record being synchronized with time, comprising:
   a. a network;
   b. an intelligent power distribution unit ("iPDU") supplying power to selected ones of the electronic devices, the iPDU operating to
      i. monitor the power consumption of selected ones of said electronic devices,
      ii. periodically report to the network said power consumption as a function of time,
      iii. disconnect individual ones of the electronic devices from power when the power consumption of said individual ones meets predetermined conditions,
      iv. reconnecting said individual ones of the electronic devices in response to instructions received from the network; and
      v. create an event log indicating which electronic devices have been so disconnected and reconnected and the times when such disconnection and reconnection have occurred;
   c. wherein the video camera reports the video record as a function of time to the network and the network includes means for synchronizing the event log with the video record, whereby such actions of persons at the table can be correlated with disconnections and reconnections of individual ones of said electronic devices.

2. The system of claim 1, herein the gaming table has a dealer station for a dealer and a video camera is aimed at said dealer station, the video camera creating a video record of actions of the dealer, such video dealer record being synchronized with time, and wherein said means for synchronizing synchronizes the event log with the video dealer record.

3. The system of claim 2, wherein there is an array of video cameras, the array being aimed at the gaming table in such a manner as to record the actions of all persons at the table, and wherein said means for synchronizing synchronizes the event log with all video records.

4. The system of claim 2, wherein each gaming station includes a video screen and gaming controls, wherein the dealer station includes a video screen and dealer controls, wherein the gaming table includes at least one computer server operatively connected to all the video screens and all the controls, and wherein the iPDU supplies powers to all the video screens, all the controls, and the server.

5. The system of claim 4, wherein the video screen at each gaming station is a touch screen and wherein the gaming controls at each gaming station are operated by touching the touch screen.

6. The system of claim 1, wherein the network is an IP network.

7. The system of claim 1, wherein the iPDU includes a transfer switch that receives power from two independent power sources and operates in a manner that when power from one of the power sources becomes unavailable, power from another one of the power sources is used to supply electrical power to the electronic devices in the gaming table.

* * * * *

UNITED STATES PATENT AND TRADEMARK OFFICE
CERTIFICATE OF CORRECTION

PATENT NO. : 9,939,875 B2  
APPLICATION NO. : 15/248740  
DATED : April 10, 2018  
INVENTOR(S) : Wood et al.

Page 1 of 1

It is certified that error appears in the above-identified patent and that said Letters Patent is hereby corrected as shown below:

In the Claims

Column 7, Line 3, Claim 2: change "herein" to --wherein--; and

Column 8, Line 2, Claim 4: change "powers" to --power--.

Signed and Sealed this  
Fifteenth Day of May, 2018

Andrei Iancu  
*Director of the United States Patent and Trademark Office*